United States Patent [19]
Endo et al.

[11] Patent Number: 5,081,068
[45] Date of Patent: Jan. 14, 1992

[54] METHOD OF TREATING SURFACE OF SUBSTRATE WITH ICE PARTICLES AND HYDROGEN PEROXIDE

[75] Inventors: Shinji Endo; Toshiaki Ohmori; Takaaki Fukumoto; Keisuke Namba, all of Hyogo, Japan

[73] Assignee: Mitsubishi Denki Kabushiki Kaisha, Tokyo, Japan

[21] Appl. No.: 546,446

[22] Filed: Jul. 3, 1990

[30] Foreign Application Priority Data

Jul. 17, 1989 [JP] Japan .................................. 1-185243

[51] Int. Cl.$^5$ .................. H01L 21/304; H01L 21/306
[52] U.S. Cl. ............................ 437/225; 437/228; 437/229; 437/946; 134/2; 134/25.4; 134/31; 134/38
[58] Field of Search .............. 134/2, 25.4, 31, 38, 134/902; 437/225, 228, 229, 946, 10

[56] References Cited

U.S. PATENT DOCUMENTS

| | | | |
|---|---|---|---|
| 4,631,250 | 12/1986 | Hayashi | 134/7 |
| 4,747,421 | 5/1988 | Hayashi | 134/7 |
| 4,820,650 | 4/1989 | Nagae | 437/10 |

FOREIGN PATENT DOCUMENTS

| | | | |
|---|---|---|---|
| 3822350 | 1/1990 | Fed. Rep. of Germany | 134/2 |
| 0096738 | 5/1986 | Japan | 437/946 |

OTHER PUBLICATIONS

Beyer, "Silicon Surface Cleaning Process", IBM Technical Disclosure Bulletin, vol. 20, No. 5, Oct. 1977, pp. 1746–1747.
Patent Abstract of Japan: M–760, Nov. 8, 1988, vol. 12, No. 419.

*Primary Examiner*—Olik Chaudhuri
*Assistant Examiner*—Ourmazd S. Ojan
*Attorney, Agent, or Firm*—Lowe, Price, LeBlanc & Becker

[57] ABSTRACT

The method of treating a surface of a substrate (12) comprises the steps of physically treating the surface by jetting hydrogen peroxide containing ice particles (28) onto the substrate surface, and chemically treating the substrate surface with hydrogen peroxide solution obtained by melting the hydrogen peroxide containing ice particles (28).

8 Claims, 6 Drawing Sheets

METHOD OF TREATING SURFACE OF SUBSTRATE WITH ICE PARTICLES AND HYDROGEN PEROXIDE

BACKGROUND OF THE INVENTION

1. Field of the Invention

The present invention relates to a method for surface treatment such as surface cleaning, surface reforming, resist removal and etching on substrates employed for electronic parts, e.g., semiconductor devices and electronic devices, and more specifically, to an improved surface treating method utilizing jetting of ice-particles.

2. Description of the Background Art

FIG. 6 is a conceptual diagram showing a cleaning method of semiconductor wafers described in Japanese Patent Laying-Open No. 62-226629.

A container 1, e.g., with cross-sectional area of 400 $\times$ 400 mm$^2$ and height of 1200mm, is filled to 500mm high with liquid nitrogen 3 provided from a liquid nitrogen source 2. By blowing nitrogen gas from a diffuser tube 4 20 in the liquid nitrogen 3 at a rate of 300l/min.m$^2$, waves of several millimeter high are produced on the surface of the liquid nitrogen 3. The nitrogen gas is provided from the liquid nitrogen source 2 through a heat exchanger 5. Meanwhile, pure water is supplied to a nozzle 6 provided at the upper part of the container 1 from a pure water source 7 under a pressure of 2.0kg/cm$^2$ and at a flow rate of 0.1l/min, and a nitrogen gas is also provided under a pressure of 2.0kg/cm$^2$ and at a flow rate of 8.0Nl/min. The pure water is jetted from the nozzle 6 into a mist, and becomes ice particles 8 in a moment in the liquid nitrogen. The ice particles 8 produced in this way are transferred into a hopper 10 by a screw feeder 9, for example. The ice particles 8 in the hopper 10 are next provided to a blasting device 11. The blasting device 11 is, for example, of high-pressure gas ejector type, which ejects the ice particles 8 at a rate of 0.3l/min, with nitrogen gas under a high pressure of 5.0kg/cm$^2$ and at a flow rate of 1.0Nl/min. The jetted ice particles 8 are directed to the surface of a substrate 12, so that contaminant particles and dirts 13 are removed away from the substrate surface by sputtering effect.

However, while impurity particles, dirts or the like on the substrate can be removed by the sputtering effect of the cleaning method of the prior art employing the jetted ice particles, there exists a problem that substances of small hardness such as sticky organic substances or the like could not be removed.

SUMMARY OF THE INVENTION

In consideration of the prior art, an object of this invention is to provide a substrate surface treating method wherein, chemical cleaning effect, surface reforming or the like can be effectively performed, in addition to physical removing effect such as sputtering.

According to one aspect of this invention, a substrate surface treating method comprises the steps of jetting ice particles containing hydrogen peroxide onto a substrate surface to treat the surface physically, and treating the substrate surface chemically with a hydrogen peroxide solution obtained by melting the ice particles containing hydrogen peroxide.

According to another aspect of this invention, a substrate surface treating method comprises the steps of jetting ice particles of pure water onto a substrate surface to treat the surface physically, and treating the surface chemically by providing a hydrogen peroxide solution onto the substrate surface.

According to still another aspect of this invention, a substrate surface treating method comprise the steps of jetting ice particles of pure water onto the substrate surface to treat the surface physically, and treating the surface chemically by providing a hydrogen peroxide containing gas onto the substrate surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
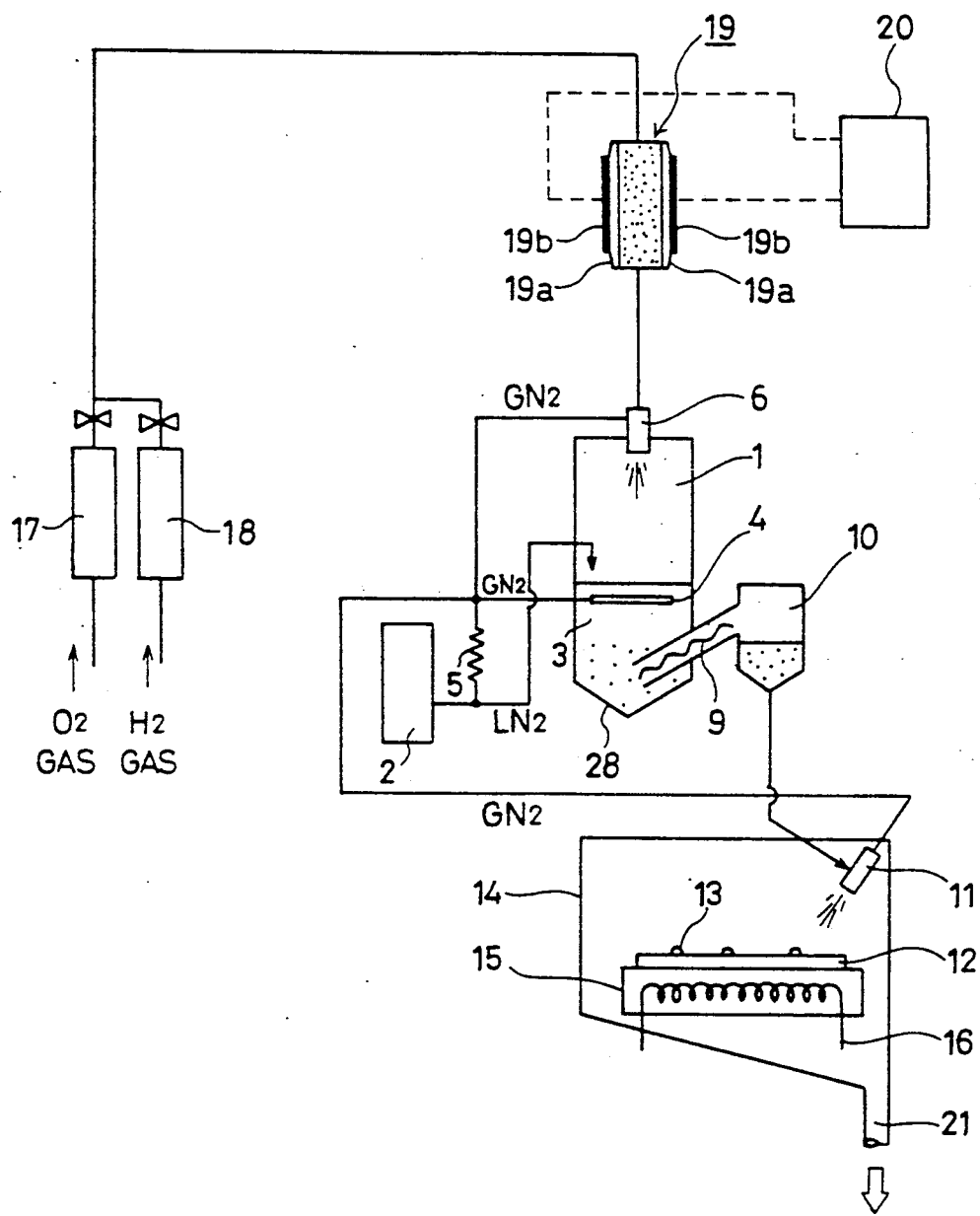
FIGS. 1 to 5 are conceptual diagrams for illustrating a method for treating a substrate surface in accordance with first to fifth embodiments of this invention, respectively.
Figure 6:
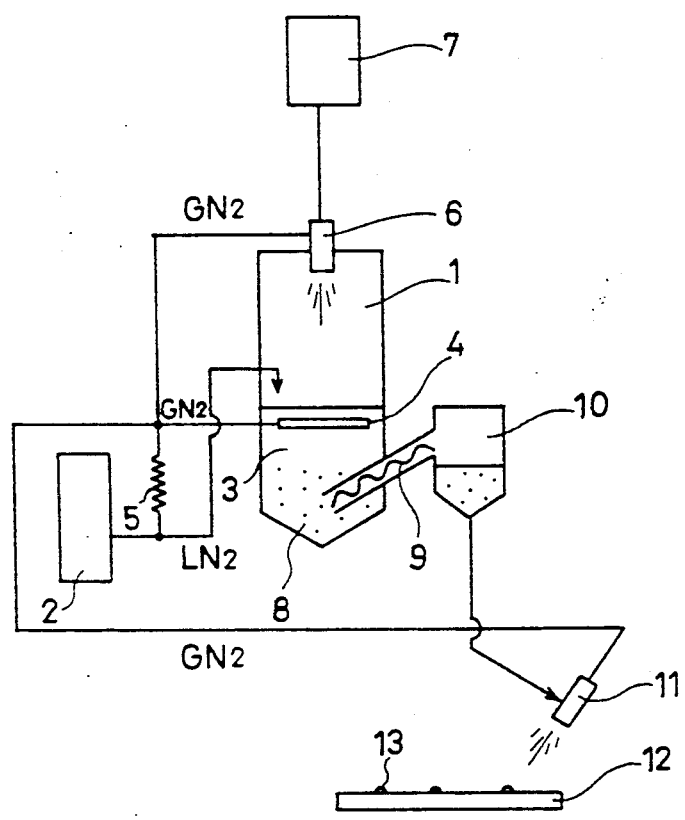
FIG. 6 is a conceptual diagram for illustrating a method of treating a substrate surface in accordance with the prior art.

Referring to FIG. 1, an embodiment of this invention will be described. In FIG. 1, the same reference numerals as those in FIG. 6 indicate corresponding parts. First, an oxygen gas and a hydrogen gas of high-purity are controlled by flow control devices 17, 18 so that respective concentrations in the mixed gas are constant, and are provided to an electric discharge device 19. The electric discharge device 19 comprises an electrode structure having two parallel dielectric plates 19a such as quartz glass plates sandwiched between two discharge electrodes 19b, and a high AC voltage from a power supply 20 is applied between the electrodes 19b. The gaseous hydrogen peroxide and water are produced between the dielectric plates 19a in the discharge device 19, are condensing in the nozzle 6, and are provided to the container 1 together with nitrogen gas to become ice particles 28 containing hydrogen peroxide. The ice particles containing hydrogen peroxide 28 are jetted onto the surface of the substrate 12 in the substrate treating container 14 by a blasting device 11 similarly as described in conjunction with FIG. 6, so that contaminant particles and dirt 13 are physically removed away.

A heater 16 for controlling the temperature of the substrate 12 is provided in a substrate table 15. After the physical cleaning by the jetted hydrogen peroxide containing ice particles 28 is completed, the substrate temperature is raised by the heater 16. The jetted hydrogen peroxide containing ice particles 28 are melted on the surface of the substrate 12 at the raised temperature to become hydrogen peroxide solution, and by the chemical action thereof, surface treatments such as chemical cleaning and surface reforming are performed on the surface of the substrate 12. Simultaneously, sticky organic substances or the like can also be removed. The hydrogen peroxide containing ice particles 28 and the hydrogen peroxide solution, after use for treating the substrate surface, are exhausted out of the system as a hydrogen peroxide solution through an exhaust port 21 provided at the lower part of the substrate treating container 14.

Thus, in the surface treating device shown in FIG. 1, chemical cleaning, surface reforming or the like in addition to physical cleaning can be easily performed in the same device.

Figure 2:
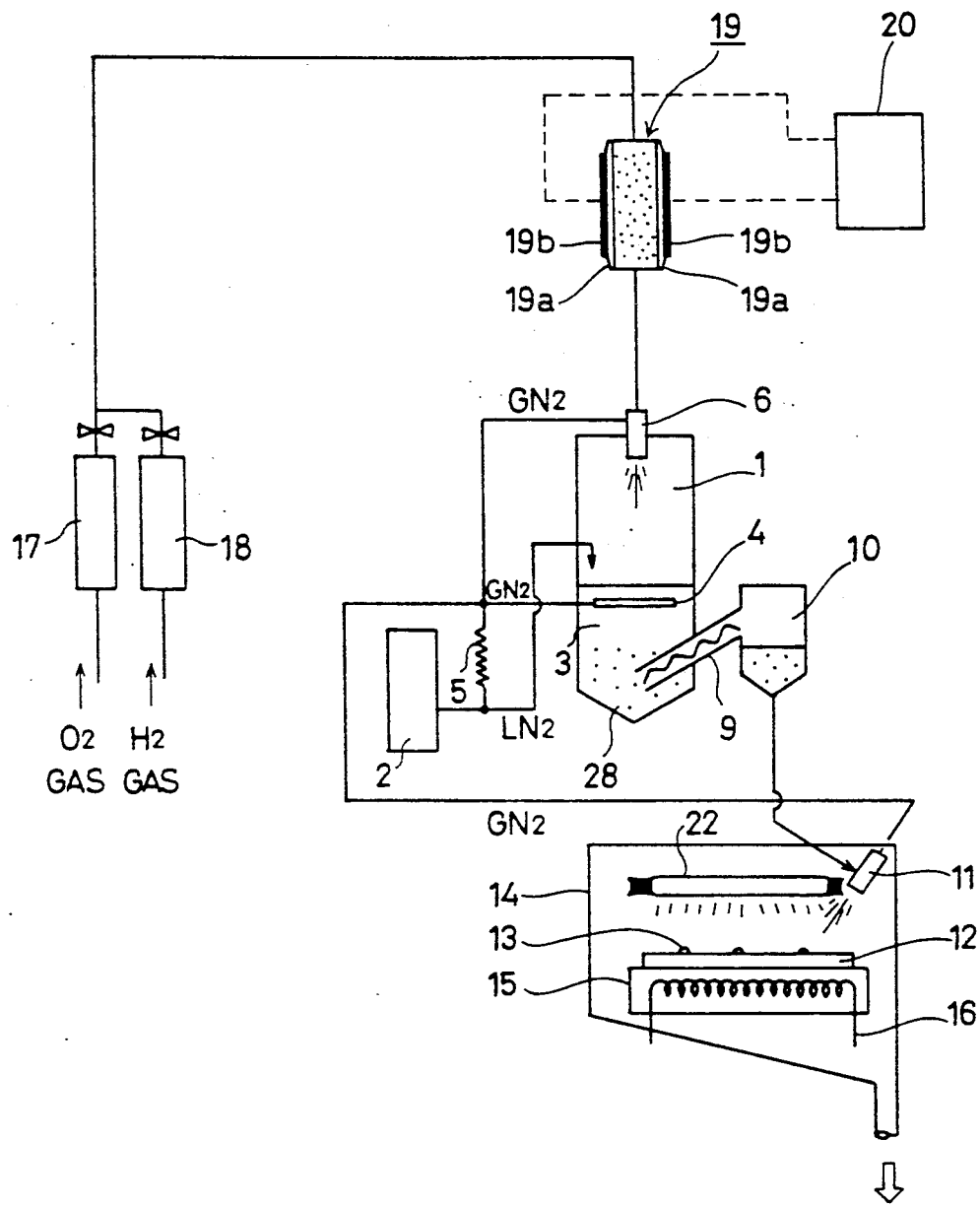

Referring to FIG. 2, another embodiment of this invention will be described. FIG. 2 is similar to FIG. 1, except that an ultraviolet source 22 is further provided in a substrate treating container 14 in FIG. 2. The ultraviolet source 22 can emit ultraviolet rays in the wavelength range of at least 180nm-260 nm.

When physical cleaning by the jetted hydrogen peroxide containing ice particles 28 is completed, the ultraviolet source 22 and the heater 16 are turned on. The temperature of the substrate 12 is raised by the heater 16 and the jetted hydrogen peroxide containing ice particles 28 melt to become a hydrogen peroxide solution on the surface of substrate 12. The hydrogen peroxide solution absorbs the ultraviolet rays to facilitate chemical reaction on the substrate 12. In other words, the ultraviolet decomposes the hydrogen peroxide on the substrate 12 to produce hydroxyl radicals. The hydroxyl radicals are so reactive that they can oxidize organics and substrates efficiently. Accordingly, in this way, by employing ultraviolet irradiation in addition, a more rapid and complete surface treating effect can be obtained.

The ultraviolet ray source 22 does not necessarily have to be provided in the substrate treating container 14, but may be provided outside of the substrate treating container 14 formed at least in part of a ultraviolet transmissive material.

Figure 3:
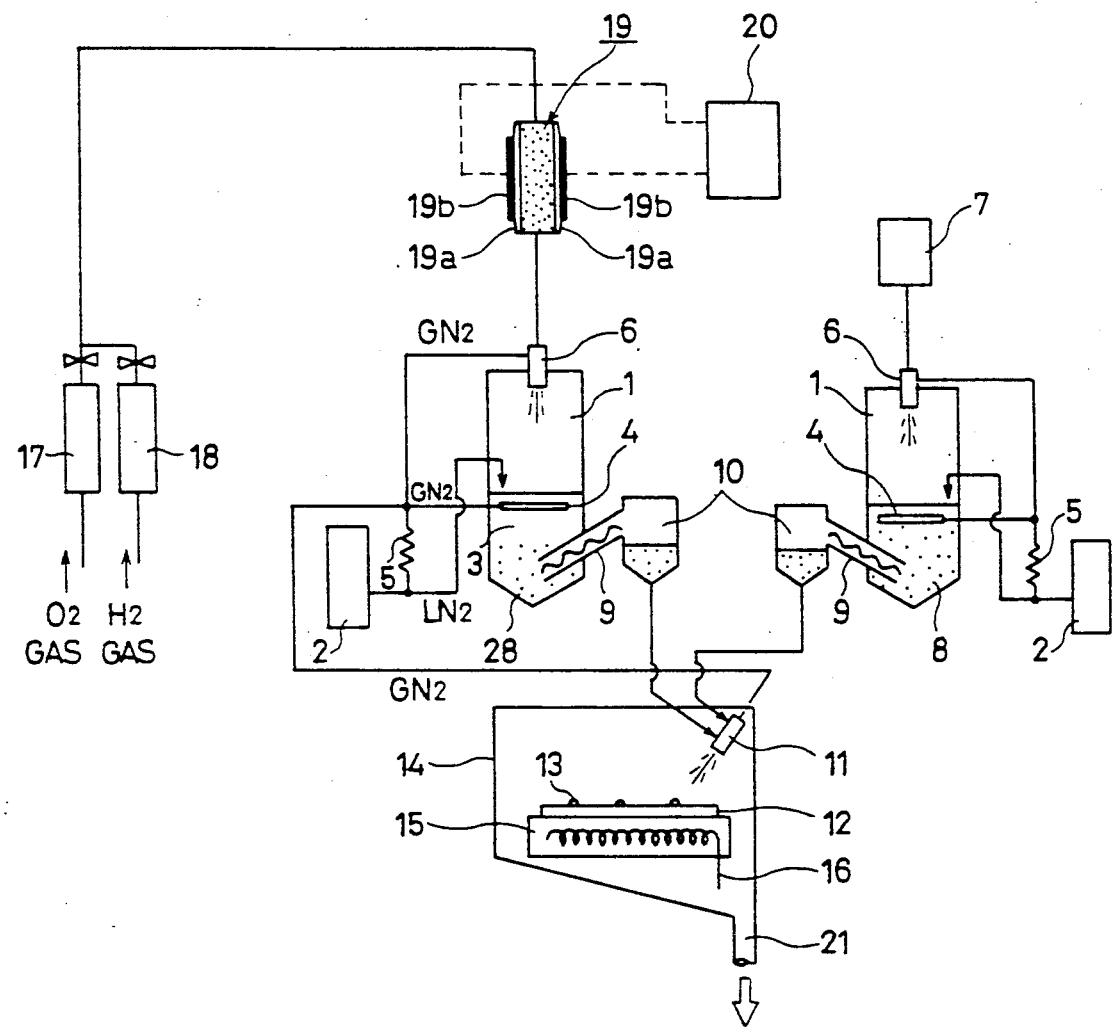

Referring to FIG. 3, still another embodiment of this invention will be described. In FIG. 3, the same reference numerals as those in FIGS. 1 and 6 indicate the corresponding parts. In the embodiment of FIG. 3, in addition to a device for producing ice particles containing hydrogen peroxide, a device for producing pure water ice particles is provided. First, pure water ice particles 8 are jetted onto a substrate surface 12 by a blasting device 11 to sputter and remove impurity particles 13, resist or the like more than 90%, for example, on the substrate surface 12. After that, the ice particles 28 containing hydrogen peroxide are jetted onto the substrate surface 12 by the blasting device 11, and the residuals such as impurity particles 13 are sputtered and removed by the hydrogen peroxide containing ice particles 28. In the same way as described in the embodiment of FIG. 1, the hydrogen peroxide containing ice particles 28 are melted, and the surface treatment is performed by the chemical action of the hydrogen peroxide solution. Thus, by utilizing ice particles 8 formed using abundant pure water for the cleaning by sputtering, the hydrogen peroxide containing ice particles 28 can be saved.

Figure 4:
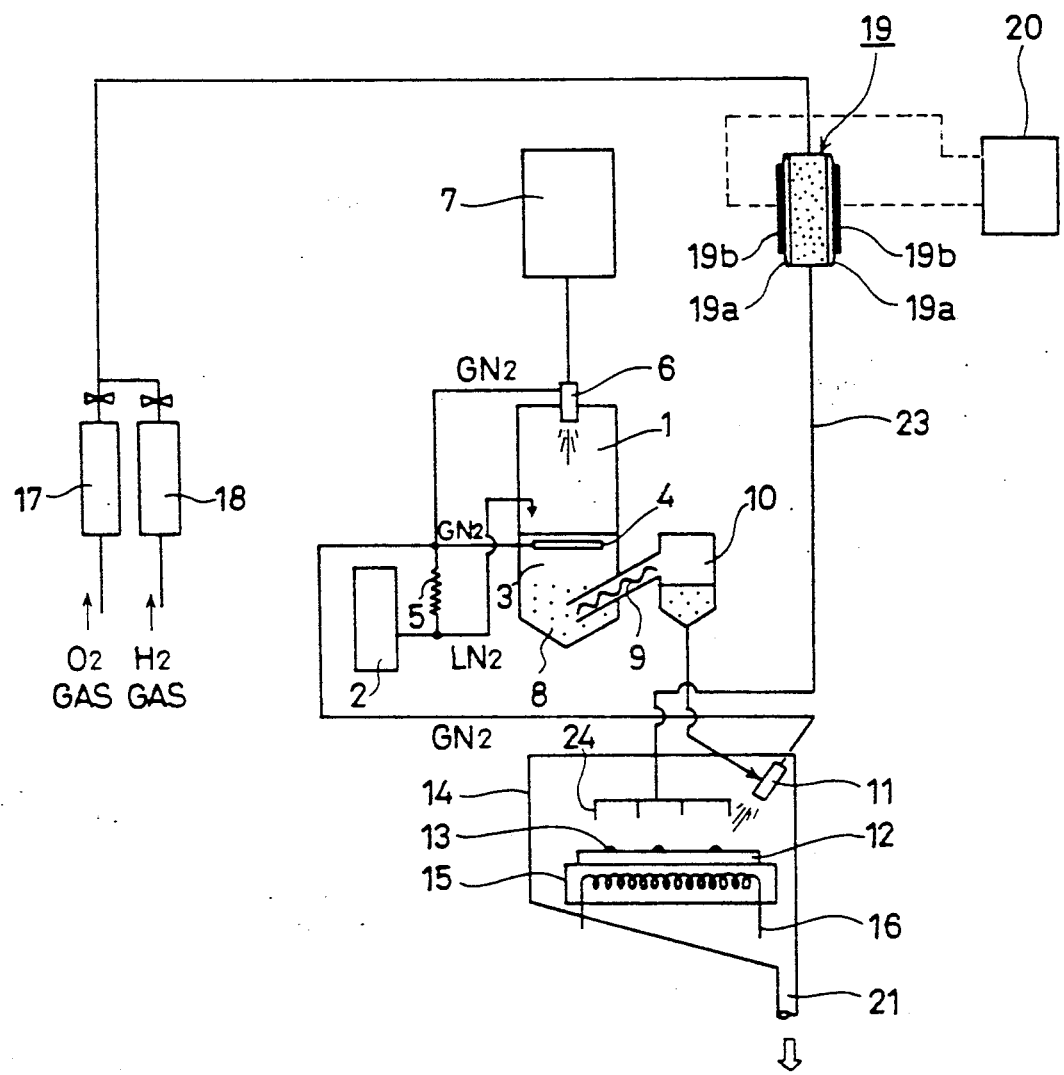

Referring to FIG. 4, yet another embodiment of this invention will be described. In FIG. 4, the same reference numerals as those in FIGS. 1 and 6 indicate the corresponding parts. In the embodiment of FIG. 4, a pipe 23 and a nozzle 24 for providing a gas containing hydrogen peroxide are provided. First, pure water ice particles 8 are jetted onto the surface of substrate 12 by a blasting device 11 to sputter and remove impurity particles 13, resist or the like on the surface of substrate 12. Subsequently, a gas containing hydrogen peroxide provided from a discharging device 19 is jetted onto the surface of substrate 12, so that the surface is treated by the chemical action of the hydrogen peroxide containing gas. In this case, the hydrogen peroxide on the surface of substrate 12 can be both in a state of gas and in a state of liquid solution depending on the temperature of the substrate 12. A heater (not shown) for avoiding condensation of the hydrogen peroxide onto the tube walls or the like may be provided in the supply pipe 23 and a nozzle 24. In the embodiment of FIG. 4, the chemical cleaning, surface reforming or the like, subsequent to the physical cleaning of the substrate surface by the jetted ice particles, can be performed by jetting hydrogen peroxide containing gas onto the substrate surface, which means that the physical and chemical treatments of substrates can be preformed in the same surface treating container.

Figure 5:
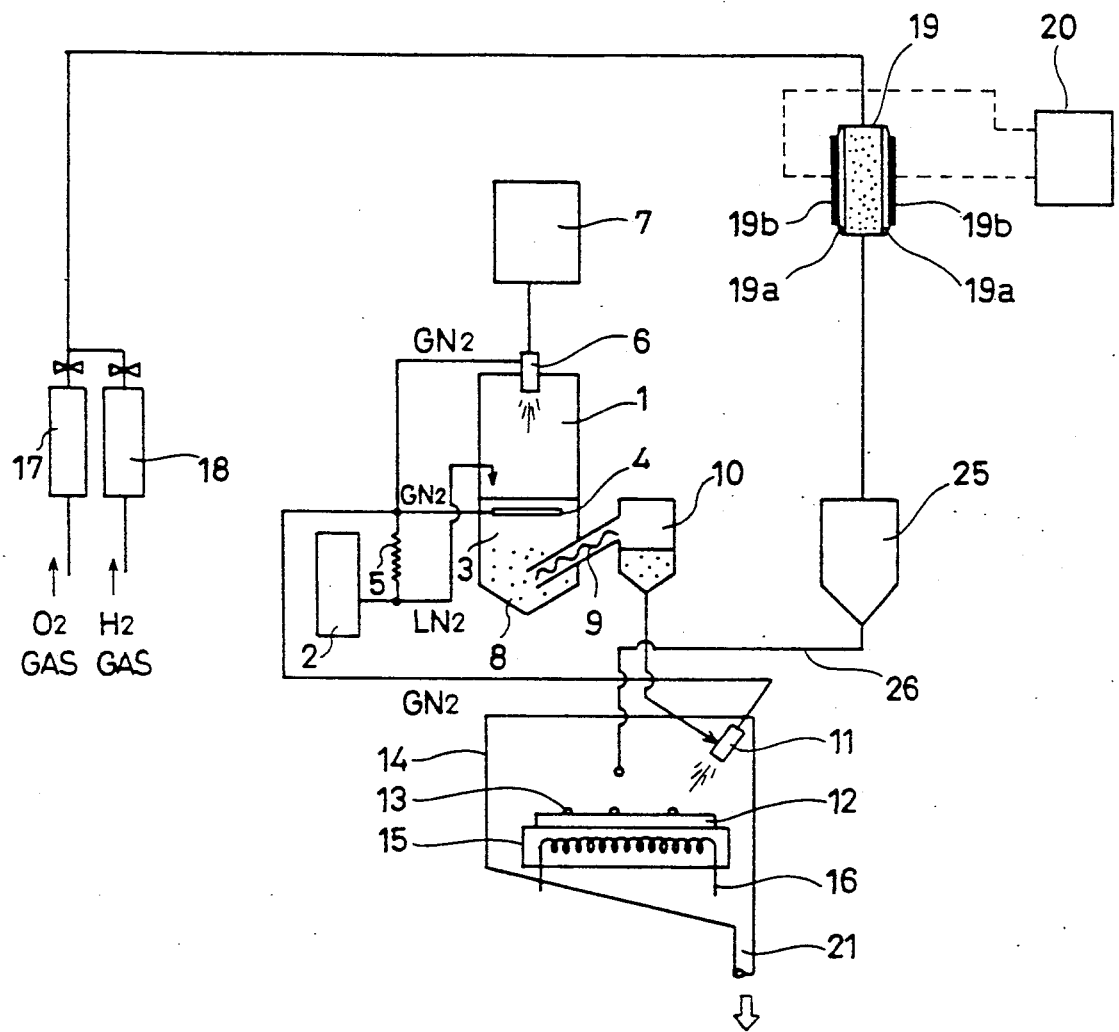

Referring to FIG. 5, still another embodiment of this invention will be described. In FIG. 5, the same reference numerals as those in FIGS. 1 and 6 indicate the corresponding part. In the embodiment of FIG. 5, a hydrogen peroxide liquifaction and reserve tank 25 and a pipe 26 for providing a hydrogen peroxide solution are provided. First, pure water ice particles 8 are jetted onto the surface of substrate 12 by a blasting device 11 to sputter and remove the impurity particles 13, resist or the like on the surface of substrate 12. The hydrogen peroxide solution can be obtained, for example, by applying a cooling collecting method to the hydrogen peroxide containing gas provided from a discharging device 19 to the hydrogen peroxide liquifaction and reserve tank 25. After the surface of substrate 12 is treated by sputtering with ice particles 8, the hydrogen peroxide solution is provided through a supply pipe 26 into the substrate treating container 14 and the surface of substrate 12 is treated by the chemical action of the hydrogen peroxide solution.

The same effect can be obtained by providing the hydrogen peroxide solution in a state of a mist to the surface of substrate 12.

In the embodiments described above, hydrogen peroxide containing gas produced by utilizing electric discharge are employed. Because high-purity oxygen and hydrogen gases are employed as material gases, impurities are not contained therein. Accordingly, the produced hydrogen peroxide containing ice particles and hydrogen peroxide solution contain no impurity.

Moreover, as water vapor only can be produced depending on the discharging condition, pure water also can be produced by utilizing electric discharge.

Meanwhile, it is also possible to use ice particles containing hydrogen peroxide produced in the same ice particle manufacturing device as that used in a conventional method employing a commercially available hydrogen peroxide solution. It is also possible to employ a commercially available hydrogen peroxide solution only for the chemical treatment. In this case, however, as the commercially available hydrogen peroxide solution contains impurities, measures for removing impurities in the hydrogen peroxide solution are required for use in semiconductor manufacturing processes.

While in each of the above embodiments, a heater is provided on a substrate table to melt ice particles containing hydrogen peroxide, the ice particles may be naturally melted without heating.

Furthermore, while one side of a substrate only is treated in each of the above embodiments, both sides of a substrate may be treated simultaneously, e.g. by jetting hydrogen peroxide containing ice particles onto the both sides of the substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating a surface of a substrate comprising the steps of;
   physically treating said surface by jetting ice particles containing hydrogen peroxide onto said substrate surface, and
   chemically treating said surface with a hydrogen peroxide solution obtained by melting said ice particles containing hydrogen peroxide.

2. The method according to claim 1-, wherein said hydrogen peroxide is produced by electrical discharge in high-purity oxygen and hydrogen gases.

3. A method of treating a surface of a substrate comprising the steps of:
   physically treating said surface by jetting pure water ice particles onto said substrate surface, and
   chemically treating said surface by providing a hydrogen peroxide solution onto said substrate surface, said hydrogen peroxide solution comprising an aqueous solution produced by electrical discharge in high purity oxygen and hydrogen gases.

4. A method of treating a surface of a substrate comprising the steps of;
   physically treating said surface by jetting pure water ice particles onto said substrate surface, and
   chemically treating said surface by providing a hydrogen peroxide containing gas onto said substrate surface.

5. The method according to claim 4, wherein said hydrogen peroxide is produced by electrical discharge in high-purity oxygen and hydrogen gases.

6. A method of treating a surface of a substrate, comprising the steps of:
   physically treating said surface by jetting pure water ice particles onto said substrate surface, and
   chemically treating said surface by providing hydrogen peroxide onto said substrate surface, wherein said hydrogen peroxide is produced by electrical discharge in high purity oxygen and hydrogen gases.

7. A method of treating a surface of a substrate comprising the steps of:
   physically treating said surface by jetting pure water ice particles onto said substrate surface,
   jetting ice particles containing hydrogen peroxide onto said substrate surface after jetting said pure water ice particles, and
   chemically treating said surface by providing a hydrogen peroxide solution onto said substrate surface, said hydrogen peroxide solution being obtained by melting said hydrogen peroxide containing ice particles.

8. The method according to claim 7, wherein said hydrogen peroxide is produced by electrical discharge in high purity oxygen and hydrogen gases.

* * * * *